United States Patent
Yamamoto et al.

(10) Patent No.: US 12,212,301 B2
(45) Date of Patent: Jan. 28, 2025

(54) COMPOSITE SUBSTRATE AND SURFACE ACOUSTIC WAVE ELEMENT

(71) Applicant: NGK Insulators, Ltd., Nagoya (JP)

(72) Inventors: Takeshi Yamamoto, Nagoya (JP); Yudai Uno, Nagoya (JP); Hiroyoshi Ina, Nisshin (JP); Keiichiro Asai, Nagoya (JP); Tomoyoshi Tai, Inazawa (JP)

(73) Assignee: NGK INSULATORS, LTD., Nagoya (JP)

(*) Notice: Subject to any disclaimer, the term of this patent is extended or adjusted under 35 U.S.C. 154(b) by 235 days.

(21) Appl. No.: 17/930,743

(22) Filed: Sep. 9, 2022

(65) Prior Publication Data

US 2023/0006634 A1    Jan. 5, 2023

Related U.S. Application Data

(63) Continuation of application No. PCT/JP2021/030894, filed on Aug. 24, 2021.

(30) Foreign Application Priority Data

Dec. 23, 2020 (JP) ................... 2020-213689

(51) Int. Cl.
    H03H 9/02 (2006.01)

(52) U.S. Cl.
    CPC .... H03H 9/02574 (2013.01); H03H 9/02559 (2013.01)

(58) Field of Classification Search
    CPC ........... H03H 9/02574; H03H 9/02559; H03H 9/175; H03H 9/25; H03H 3/02; H03H 3/08; H03H 9/02228; H03H 9/058; H03H 9/145; H03H 2003/025; H03H 3/10; H03H 9/02834; H03H 9/02897; H03H 9/13; H03H 9/02157; H03H 9/02866; H03H 9/0504;

(Continued)

(56) References Cited

U.S. PATENT DOCUMENTS

| | | |
|---|---|---|
| 8,829,766 B2 | 9/2014 | Milyutin et al. |
| 10,797,680 B2 | 10/2020 | Mimura |
| 2016/0027988 A1 | 1/2016 | Nagahata |

(Continued)

FOREIGN PATENT DOCUMENTS

| | | |
|---|---|---|
| JP | 2019-102883 A | 6/2019 |
| JP | 2020-098345 A | 6/2020 |

(Continued)

OTHER PUBLICATIONS

Korean Office Action (with English translation) dated May 23, 2024 (Application No. 10-2022-7034396).

(Continued)

*Primary Examiner* — Lincoln D Donovan
*Assistant Examiner* — Tyler J Pereny
(74) *Attorney, Agent, or Firm* — BURR PATENT LAW, PLLC (57) ABSTRACT

A composite substrate includes: a piezoelectric layer; and a reflective layer arranged on a rear surface side of the piezoelectric layer, wherein the reflective layer includes a high-impedance layer and a low-impedance layer containing silicon oxide, and wherein a ratio of a region of first structures in the high-impedance layer is more than 70%.

9 Claims, 6 Drawing Sheets

(58) Field of Classification Search
CPC .... H03H 9/0561; H10N 30/072; H10N 30/06; H10N 30/09
See application file for complete search history.

(56) References Cited

U.S. PATENT DOCUMENTS

| | | | |
|---|---|---|---|
| 2018/0205361 A1* | 7/2018 | Kishimoto | H03H 9/175 |
| 2019/0165763 A1* | 5/2019 | Mimura | H03H 9/02834 |
| 2019/0207583 A1* | 7/2019 | Miura | H03H 9/02866 |
| 2019/0222189 A1 | 7/2019 | Tai et al. | |
| 2022/0069803 A1 | 3/2022 | Nozoe | |

FOREIGN PATENT DOCUMENTS

| | | |
|---|---|---|
| JP | 2020-150488 A | 9/2020 |
| WO | 2019/054238 A1 | 3/2019 |
| WO | 2020/130128 A1 | 6/2020 |

OTHER PUBLICATIONS

English translation of the International Preliminary Report on Patentability (Chapter I) dated Jul. 6, 2023 (Application No. PCT/JP2021/030894).

Japanese Office Action (Application No. 2020-213689) dated Jun. 29, 2021 (with English translation).

International Search Report and Written Opinion (Application No. PCT/JP2021/030894) dated Nov. 9, 2021 (with English translation).

* cited by examiner

COMPOSITE SUBSTRATE AND SURFACE ACOUSTIC WAVE ELEMENT

CROSS-REFERENCE TO RELATED APPLICATIONS

This application is a continuation under 35 U.S.C. 120 of International Application PCT/JP2021/030894 having the International Filing Date of Aug. 24, 2021, and having the benefit of the earlier filing date of Japanese Application No. 2020-213689, filed on Dec. 23, 2020. Each of the identified applications is fully incorporated herein by reference.

BACKGROUND OF THE INVENTION

Technical Field

The present invention relates to a composite substrate and a surface acoustic wave element.

Background Art

For example, a filter utilizing a surface acoustic wave (SAW filter) has been used in a communication device such as a cellular phone for extracting an electric signal having any appropriate frequency. The SAW filter has a structure in which an electrode or the like is formed on a composite substrate having a piezoelectric layer (see, for example, Patent Literature 1).

Incidentally, in recent years, in the field of an information communication device, the device has been required to support communication in a high-frequency band. In the SAW filter, the leakage of an elastic wave from the piezoelectric layer may occur. Meanwhile, the composite substrate has been required to have heat resistance at the time of its processing (e.g., in a step in which heat having a temperature of 200° C. or more is applied).

CITATION LIST

Patent Literature

[PTL 1] JP 2020-150488 A

SUMMARY OF THE INVENTION

A primary object of the present invention is to provide a composite substrate that is excellent in heat resistance while confining the energy of an elastic wave in its piezoelectric layer.

According to one embodiment of the present invention, there is provided a composite substrate, including: a piezoelectric layer; and a reflective layer arranged on a rear surface side of the piezoelectric layer, wherein the reflective layer includes a high-impedance layer and a low-impedance layer containing silicon oxide, and wherein a ratio of a region of first structures in the high-impedance layer is more than 70%.

In one embodiment, the first structures are columnar structures or granular structures.

In one embodiment, the high-impedance layer contains at least one selected from: hafnium oxide; tantalum oxide; zirconium oxide; and aluminum oxide.

In one embodiment, the first structures are unevenly distributed on a side of an interface with an adjacent layer or an air layer opposite the other interface of the high-impedance layer in a thickness direction of the high-impedance layer.

In one embodiment, the high-impedance layer has second structures, and a boundary between the first structures and the second structures is present in the high-impedance layer.

In one embodiment, the high-impedance layer and the low-impedance layer each have a thickness of from 0.01 μm to 1 μm.

In one embodiment, the high-impedance layer and the low-impedance layer are alternately laminated in the reflective layer.

In one embodiment, the composite substrate further includes a support substrate arranged on a rear surface side of the reflective layer.

In one embodiment, the composite substrate further includes a joining layer arranged between the reflective layer and the support substrate.

According to another embodiment of the present invention, there is provided a surface acoustic wave element, including the above-mentioned composite substrate.

Advantageous Effects of Invention

According to the embodiment of the present invention, there can be provided the composite substrate that is excellent in heat resistance while confining the energy of an elastic wave in the piezoelectric layer through the combination of the piezoelectric layer and the impedance layers each having a predetermined structure state.

DESCRIPTION OF EMBODIMENTS

Embodiments of the present invention are described below. However, the present invention is not limited to these embodiments.

A. Composite Substrate

Figure 1:
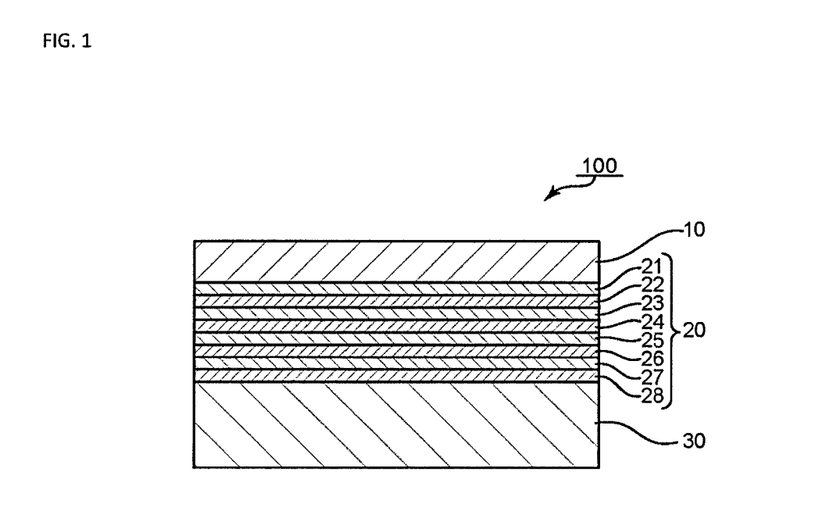
FIG. 1 is a schematic sectional view for illustrating the schematic configuration of a composite substrate according to one embodiment of the present invention.

FIG. 1 is a schematic sectional view for illustrating the schematic configuration of a composite substrate according to one embodiment of the present invention. A composite substrate 100 includes a piezoelectric layer 10, a reflective layer 20, and a support substrate 30 in the stated order. The reflective layer 20 includes a high-impedance layer having a relatively high acoustic impedance and a low-impedance layer having a relatively low acoustic impedance. The reflective layer 20 is a laminate of a plurality of impedance layers, and for example, the high-impedance layer and the low-impedance layer are alternately laminated. In the illustrated example, the reflective layer 20 includes a low-impedance layer 21, a high-impedance layer 22, a low-impedance layer 23, a high-impedance layer 24, a low-impedance layer 25, a high-impedance layer 26, a low-impedance layer 27, and a high-impedance layer 28 in the stated order from the piezoelectric layer 10 side. In the illustrated example, the low-impedance layer 21 out of the respective layers of the reflective layer 20 is arranged on the side closest to the piezoelectric layer 10. The arrangement of the reflective layer 20 having such laminated structure can effectively confine the energy of an elastic wave to the piezoelectric layer 10 side.

In the illustrated example, the reflective layer 20 is a laminate of a total of 8 layers, that is, the 4 high-impedance layers and the 4 low-impedance layers. However, the number of the impedance layers in the reflective layer is not limited thereto. Specifically, the reflective layer only needs to include at least one high-impedance layer and at least one low-impedance layer, the layers being different from each other in acoustic impedance. The reflective layer preferably has a multilayer structure including 4 or more layers.

The composite substrate 100 may further include any appropriate layer (not shown). The kinds, functions, number, combination, arrangement, and the like of such layers may be appropriately set in accordance with purposes. For example, the composite substrate 100 may include a joining layer arranged between the reflective layer 20 and the support substrate 30.

The composite substrate 100 may be produced in any appropriate shape. In one embodiment, the substrate may be produced in the form of a so-called wafer. The size of the composite substrate 100 may be appropriately set in accordance with purposes. For example, the diameter of the wafer is from 50 mm to 150 mm.

A-1. Piezoelectric Layer

Any appropriate piezoelectric material may be used as a material for forming the piezoelectric layer. A single crystal having the composition of $LiAO_3$ is preferably used as the piezoelectric material. Herein, A represents one or more kinds of elements selected from the group consisting of: niobium; and tantalum. Specifically, $LiAO_3$ may be lithium niobate ($LiNbO_3$), lithium tantalate ($LiTaO_3$), or a lithium niobate-lithium tantalate solid solution.

When the piezoelectric material is lithium tantalate, a layer whose normal direction is rotated about X-axis of the piezoelectric material, which is the direction in which a surface acoustic wave propagates, from Y-axis thereof to Z-axis thereof by from 123° to 133° (e.g., 128°) is preferably used as the piezoelectric layer from the viewpoint of reducing a propagation loss. When the piezoelectric material is lithium niobate, a layer whose normal direction is rotated about X-axis of the piezoelectric material, which is the direction in which a surface acoustic wave propagates, from Y-axis thereof to Z-axis thereof by from 86° to 94° (e.g., 90°) is preferably used as the piezoelectric layer from the viewpoint of reducing a propagation loss.

The thickness of the piezoelectric layer is, for example, 0.2 μm or more and 30 μm or less.

A-2. Reflective Layer

As described above, the reflective layer includes the high-impedance layer and the low-impedance layer different from each other in acoustic impedance. The acoustic impedance of the high-impedance layer is relatively higher than the acoustic impedance of the low-impedance layer. Specifically, the acoustic impedance of a material for forming the high-impedance layer is higher than the acoustic impedance of a material for forming the low-impedance layer.

The plurality of high-impedance layers in the reflective layer may be identical to each other in configuration (e.g., material, structure state, or thickness), or may be different from each other in configuration. Similarly, the plurality of low-impedance layers in the reflective layer may be identical to each other in configuration (e.g., material, structure state, or thickness), or may be different from each other in configuration.

Examples of the material for forming the high-impedance layer include hafnium oxide, tantalum oxide, zirconium oxide, and aluminum oxide. Of those, hafnium oxide is preferably used. The use of hafnium oxide can more effectively confine the energy of an elastic wave to the piezoelectric layer side. In one embodiment, the content of hafnium oxide in the high-impedance layer is, for example, 97 wt % or more.

The thickness of the high-impedance layer is preferably 1 μm or less, more preferably 500 nm or less, still more preferably 300 nm or less. Such thickness can provide a composite substrate that is more excellent in heat resistance. Meanwhile, the thickness of the high-impedance layer is, for example, 0.01 μm or more, preferably 20 nm or more, more preferably 100 nm or more.

The high-impedance layer has the region of first structures. The first structures are, for example, columnar structures or granular structures. Herein, the columnar structures are each formed of a structural body (columnar body) extending in a direction having an angle with respect to the substrate surface (in-plane direction) of the composite substrate, and their column diameters are, for example, 5 nm or more. Meanwhile, the granular structures are each formed of a substantially spherical structural body. Such structures may be observed by, for example, observation with a scanning electron microscope (SEM). The column diameter may not be satisfied at all the positions of the columnar body to be observed in its thickness direction.

The first structures may be interspersed, or may be unevenly distributed in the thickness direction of the high-impedance layer. In one embodiment, the first structures are unevenly distributed from an interface with an adjacent layer or an air layer toward the other interface in the thickness direction of the high-impedance layer. In the example illustrated in FIG. 2, the high-impedance layer has: a region 71 positioned on one interface 51 side, the region including the first structures 73; and a region 72 positioned on the other interface 52 side, the region including second structures 74. The region 71 and the region 72 are continuously formed, and a boundary (interface) between the region 71 and the region 72 is represented by a broken line. The second structures 74 have structures having shapes different from those of the first structures 73, and are, for example, granular structures or columnar structures. The high-impedance layer may include any other structure. In the example illustrated in FIG. 2, the columnar structures are mainly observed in the region 71, and the granular structures are mainly observed in the region 72. Specifically, it can be said that the region 71 is a columnar construction including a plurality of columnar structural bodies, and it can be said that the region 72 is a granular construction including a plurality of granular structural bodies. In such form, the problems of peeling and cracking to be described later tend to be liable to occur.

The ratio of the region of the first structures in the high-impedance layer is more than 70%, preferably 75% or more, more preferably 80% or more, still more preferably 90% or more. When the ratio falls within such ranges, a composite substrate excellent in heat resistance can be obtained. Specifically, the first structures and the second structures differ from each other in stress caused by heating or the like (e.g., a tensile stress may occur in a columnar structure and a compressive stress may occur in a granular structure), and at an interface between the first structures and the second structures, their respective stresses may concentrate. Peeling and cracking are liable to be caused by a thermal history at such interface. However, when the ratio of the region of the first structures is set within the above-mentioned ranges, the influences of the respective stresses are reduced, and hence the occurrence of the peeling and the cracking by the thermal history can be suppressed. As described above, one feature of the present invention lies in that attention is paid to the occurrence of the peeling and the cracking, and a structure state in the layer. It is preferred that in each of all the high-impedance layers in the reflective layer, the ratio of the region of the first structures be more than 70%. This is because the peeling and the cracking in the layer may occur irrespective of the position of the layer in the composite substrate (reflective layer).

The ratio of the region of the second structures in the high-impedance layer is preferably less than 30%, more preferably 25% or less, still more preferably 20% or less, particularly preferably 10% or less.

Figure 2:
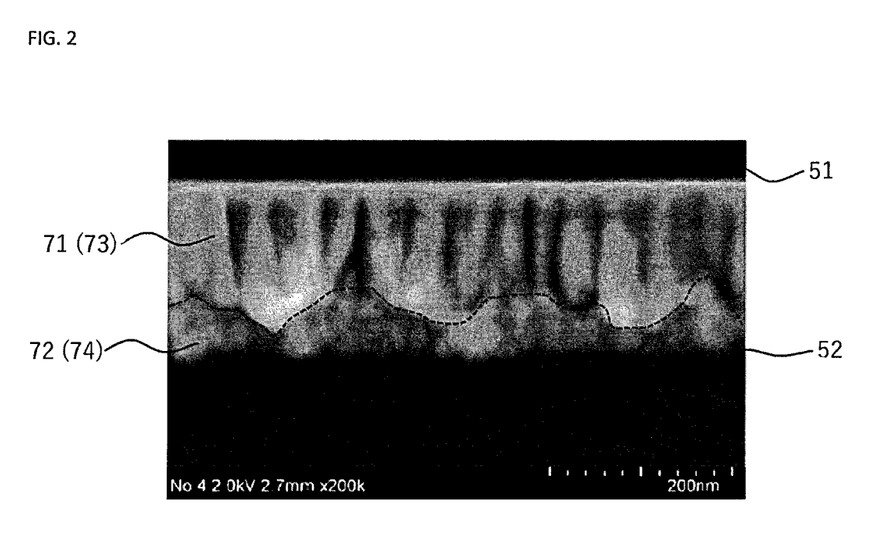
FIG. 2 is a sectional SEM observation photograph for showing an example of a high-impedance layer.

The ratio of the region of the first structures in the high-impedance layer may be identified by, for example, SEM observation. In one embodiment, the ratio may be determined by: measuring the maximum and minimum of distances (thicknesses) from the one interface 51 to the region 72 including the second structures; averaging the measured values to determine the thickness of the region of the first structures; and calculating the ratio of the thickness to the thickness of the high-impedance layer.

A typical example of the material for forming the low-impedance layer is silicon oxide. The low-impedance layer typically has the region of granular structures.

The thickness of the low-impedance layer is, for example, from 0.01 µm to 1 µm, preferably from 20 nm to 500 nm, more preferably from 100 nm to 300 nm.

The impedance layers may be formed by any appropriate method. The layers may be formed by, for example, physical vapor deposition, such as sputtering or ion beam-assisted deposition (IAD), chemical vapor deposition, or an atomic layer deposition (ALD) method.

The impedance layers may each be formed by, for example, sputtering a target containing the oxide. The structure state of each of the impedance layers may be controlled by, for example, adjusting a pressure in a space for forming the impedance layer. In one embodiment, the pressure in the layer-forming space is set to 0.15 Pa or more and less than 0.30 Pa. In another embodiment, the pressure in the layer-forming space is set to more than 0.50 Pa and 0.80 Pa or less. A layer-forming temperature is, for example, from normal temperature to 200° C.

A-3. Support Substrate

Any appropriate substrate may be used as the support substrate 30. The support substrate may include a single crystalline substance, or may include a polycrystalline substance. A material for forming the support substrate is preferably selected from: silicon; sialon; sapphire; cordierite; mullite; glass; quartz; crystal; and alumina.

The silicon may be single crystal silicon, polycrystalline silicon, or high resistance silicon.

Typically, the sialon is a ceramic obtained by sintering a mixture of silicon nitride and alumina, and has composition represented by, for example, $Si_{6-w}Al_wO_wN_{8-w}$. Specifically, the sialon has such composition that alumina is mixed into silicon nitride, and "w" in the formula represents the mixing ratio of alumina. "w" preferably represents 0.5 or more and 4.0 or less.

Typically, the sapphire is a single crystalline substance having the composition of $Al_2O_3$, and the alumina is a polycrystalline substance having the composition of $Al_2O_3$. The alumina is preferably translucent alumina.

Typically, the cordierite is a ceramic having the composition of $2MgO\cdot2Al_2O_3\cdot5SiO_2$, and the mullite is a ceramic having composition in the range of from $3Al_2O_3\cdot2SiO_2$ to $2Al_2O_3\cdot SiO_2$.

The thermal expansion coefficient of the material for forming the support substrate is preferably smaller than the thermal expansion coefficient of the material for forming the piezoelectric layer. Such support substrate can suppress changes in shape and size of the piezoelectric layer at the time of a temperature change, and hence can suppress, for example, a change in frequency characteristic of a surface acoustic wave element to be obtained.

Any appropriate thickness may be adopted as the thickness of the support substrate. The thickness of the support substrate is, for example, from 100 µm to 1,000 µm.

A-4. Joining Layer

As described above, the composite substrate may include the joining layer. A material for forming the joining layer is, for example, a silicon oxide, silicon, tantalum oxide, niobium oxide, aluminum oxide, titanium oxide, or hafnium oxide. For example, the joining layer has composition different from that of each of the impedance layers. The thickness of the joining layer is, for example, from 0.005 µm to 1 µm.

The joining layer may be formed by any appropriate method. Specifically, the layer may be formed by the same method as the above-mentioned method of forming the impedance layers.

A-5. Production Method

The composite substrate may be obtained by, for example, sequentially forming the impedance layers for forming the reflective layer on the piezoelectric layer or a piezoelectric layer precursor, and directly joining the piezoelectric layer or the piezoelectric layer precursor having formed thereon the reflective layer and the support substrate.

Figure 3A:
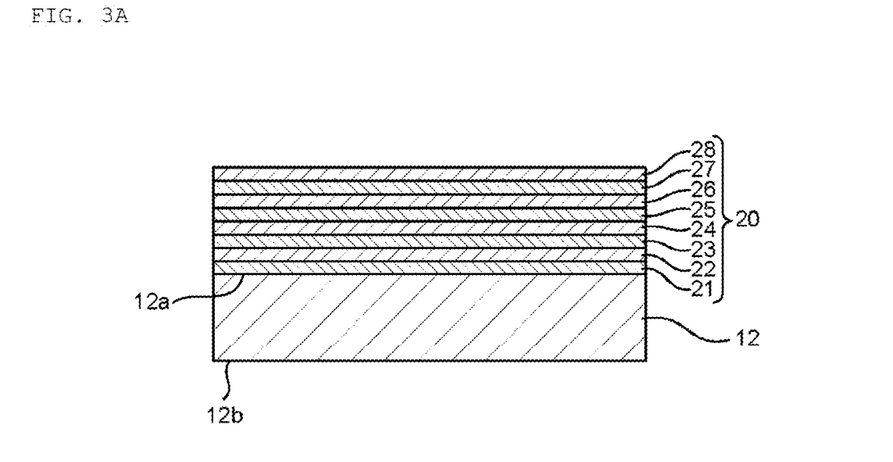
FIG. 3A is a view for illustrating an example of a production process for the composite substrate according to one embodiment.

FIG. 3A to FIG. 3D are views for illustrating an example of a production process for the composite substrate according to one embodiment. FIG. 3A is an illustration of a state in which the formation of the reflective layer 20 (impedance layers 21 to 28) on a piezoelectric layer precursor 12 is completed. The piezoelectric layer precursor 12 has a first main surface 12a and a second main surface 12b, and the impedance layers 21 to 28 are sequentially formed on the first main surface 12a side to form the reflective layer 20.

Figure 3B:
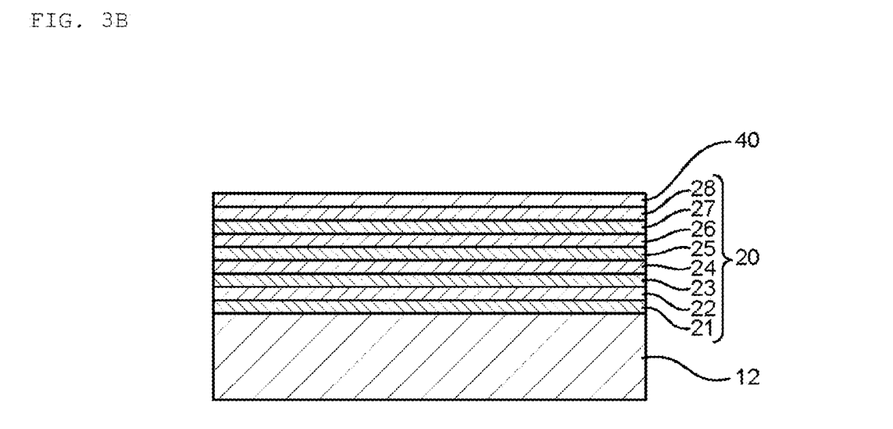
FIG. 3B is a view subsequent to FIG. 3A.
Figure 3C:
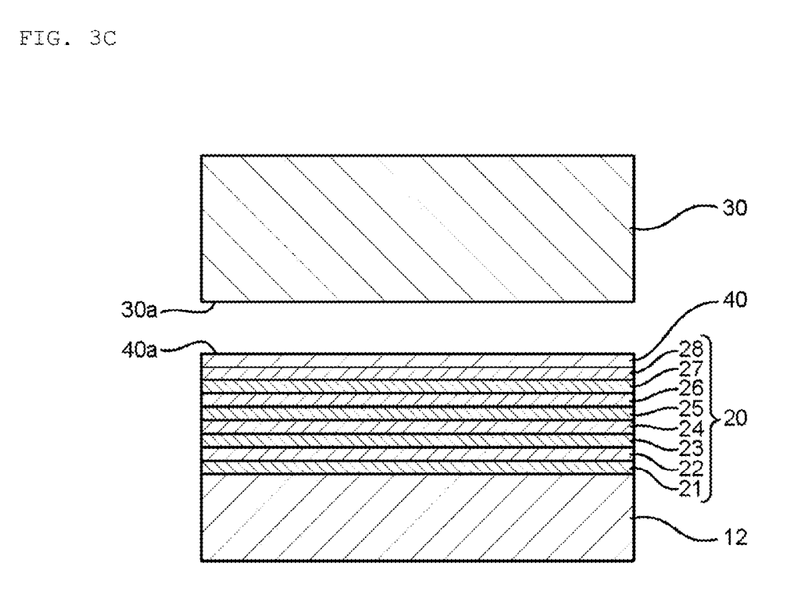
FIG. 3C is a view subsequent to FIG. 3B.
Figure 3D:
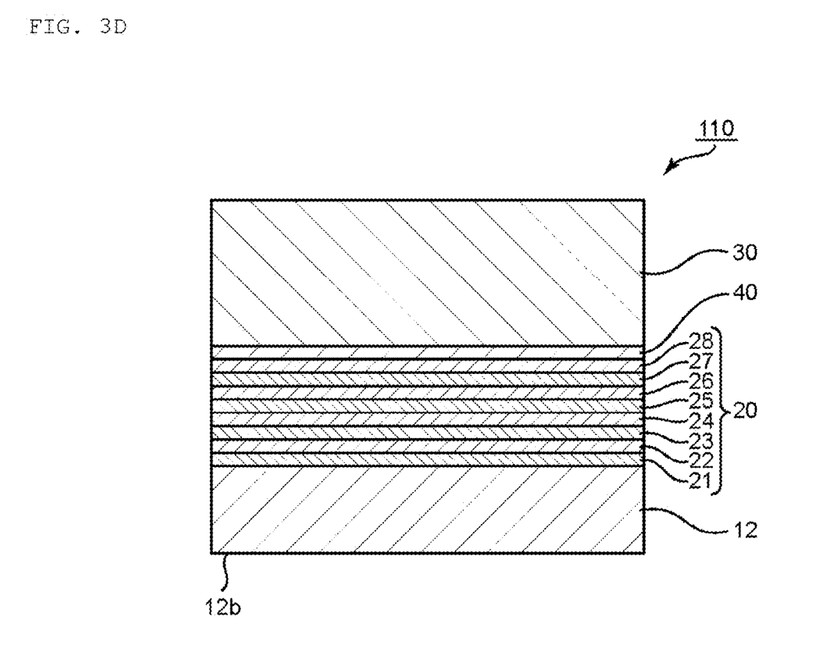
FIG. 3D is a view subsequent to FIG. 3C.

FIG. 3B is an illustration of a state in which a joining layer 40 is formed on the reflective layer 20, and FIG. 3C is an illustration of a step of directly joining the piezoelectric layer precursor 12 having formed thereon the reflective layer 20 and the joining layer 40, and the support substrate 30. At the time of the direct joining, the joining surfaces are preferably activated by any appropriate activation treatment. The direct joining is performed by, for example, activating a surface 40a of the joining layer 40, activating a surface 30a of the support substrate 30, then bringing the activated surface of the joining layer 40 and the activated surface of the support substrate 30 into contact with each other, and pressurizing the resultant. Thus, a composite substrate 110 illustrated in FIG. 3D is obtained. The second main surface 12b of the piezoelectric layer precursor 12 of the resultant composite substrate 110 is typically subjected to processing (not shown), such as grinding or polishing, so that a piezoelectric layer having the above-mentioned desired thickness may be obtained.

The surface of each layer (specifically, the piezoelectric layer or the piezoelectric layer precursor, the reflective layer, the support substrate, or the joining layer) is preferably a flat surface. Specifically, the surface roughness Ra of the surface of each layer is preferably 1 nm or less, more preferably 0.3 nm or less. A method of flattening the surface of each layer is, for example, mirror polishing, lap polishing, or chemical-mechanical polishing (CMP).

At the time of the film formation and the joining described above, the surface of each layer is preferably washed for, for example, removing the residue of a polishing agent, a work-affected layer, or the like. A method for the washing is, for example, wet washing, dry washing, or scrub washing. Of those, the scrub washing is preferred because the surface can be simply and efficiently washed. A specific example of the scrub washing is a method including washing the surface in a scrub washing machine with a detergent (e.g., a SUN-WASH series manufactured by Lion Corporation) and then with a solvent (e.g., a mixed solution of acetone and isopropyl alcohol (IPA)).

The activation treatment is typically performed by irradiating the joining surface with a neutralized beam. The activation treatment is preferably performed by generating the neutralized beam with an apparatus such as an apparatus described in JP 2014-086400 A, and irradiating the joining surface with the beam. Specifically, a saddle-field fast atomic beam source is used as a beam source, and an inert gas, such as argon or nitrogen, is introduced into the chamber of the apparatus, followed by the application of a high voltage from the DC power source thereof to an electrode thereof. Thus, a saddle-field electric field is generated between the electrode (positive electrode) and the casing (negative electrode) thereof to cause electron motion, to thereby generate the beams of an atom and an ion by the inert gas. Of the beams that have reached the grid of the fast atomic beam source, an ion beam is neutralized by the grid, and hence the beam of a neutral atom is emitted from the fast atomic beam source. The voltage at the time of the activation treatment by the beam irradiation is preferably set to from 0.5 kV to 2.0 kV, and a current at the time of the activation treatment by the beam irradiation is preferably set to from 50 mA to 200 mA.

The joining surfaces are preferably brought into contact with each other and pressurized in a vacuum atmosphere. A temperature at this time is typically normal temperature. Specifically, the temperature is preferably 20° C. or more and 40° C. or less, more preferably 25° C. or more and 30° C. or less. A pressure to be applied is preferably from 100 N to 20,000 N.

B. Surface Acoustic Wave Element

A surface acoustic wave element according to the present invention includes the above-mentioned composite substrate. The composite substrate is excellent in heat resistance, and hence the surface acoustic wave element obtained by, for example, subjecting the composite substrate to the formation of an electrode or the like and processing (including heat treatment) such as cutting is suppressed from causing peeling, cracking, and the like. Such surface acoustic wave element is suitably used as a SAW filter in a communication device such as a cellular phone.

EXAMPLES

Now, the present invention is specifically described by way of Examples. However, the present invention is not limited by these Examples.

Example 1-1

A lithium tantalate (LT) substrate having an orientation flat (OF) portion, and having a diameter of 4 inches and a thickness of 250 μm (such a 128° Y-cut X-propagation LT substrate that the direction in which a surface acoustic wave (SAW) propagated was represented by X, the substrate being a rotated Y-cut plate having a cut-out angle of 128°) was prepared. The surface of the LT substrate was subjected to mirror polishing so as to have an arithmetic average roughness Ra of 0.3 nm. Herein, the arithmetic average roughness Ra is a value measured with an atomic force microscope (AFM) in a field of view measuring 10 μm by 10 μm.

Next, a silicon oxide layer (thickness: 150 nm) and a hafnium oxide layer (thickness: 150 nm) were formed in the stated order on the polished surface of the LT substrate. Specifically, the layers were formed in a single-wafer sputtering apparatus (RF magnetron sputtering method) with a $SiO_2$ target and a $HfO_2$ target each having a diameter of 10 inches under the conditions of a power source electric power of 2 kW, a T-S distance of 65 mm, and a pressure of 0.65 Pa. After that, the layer formation was repeated three times to form such a reflective layer as illustrated in FIG. 1.

Next, a silicon oxide layer (thickness: from 80 nm to 190 nm, arithmetic average roughness Ra: from 0.2 nm to 0.6 nm) was formed on the reflective layer. Specifically, the layer was formed by a DC sputtering method with a boron-doped Si target. In addition, an oxygen gas was introduced as an oxygen source. At this time, the total pressure and oxygen partial pressure of an atmosphere in the chamber of the apparatus were regulated by regulating the amount of the oxygen gas to be introduced. After that, the surface of the silicon oxide layer was subjected to chemical-mechanical polishing (CMP). Thus, a joining layer (thickness: 50 nm, arithmetic average roughness Ra: from 0.08 nm to 0.4 nm) was formed.

A support substrate made of silicon having an OF portion, and having a diameter of 4 inches and a thickness of 500 μm was prepared. The surface of the support substrate was subjected to chemical-mechanical polishing (CMP), and had an arithmetic average roughness Ra of 0.2 nm.

Next, the LT substrate and the support substrate were directly joined. Specifically, the surface (joining layer side) of the LT substrate and the surface of the support substrate were washed, and then both the substrates were loaded into the vacuum chamber of the apparatus, followed by its evacuation to a vacuum of the order of $10^{-6}$ Pa. After that, the surfaces of both the substrates were irradiated with fast atomic beams (acceleration voltage: 1 kV, Ar flow rate: 27 sccm) for 120 seconds. After the irradiation, the beam-irradiated surfaces of both the substrates were superimposed on each other, and both the substrates were joined by being pressurized at 10,000 N for 2 minutes. After that, the resultant joined body was heated at 100° C. for 20 hours.

Next, the rear surface of the LT substrate of the joined body was ground and polished so that the thickness of the substrate was reduced from its initial value, that is, 250 μm to 1 μm. Thus, a composite substrate was obtained.

Figure 4:
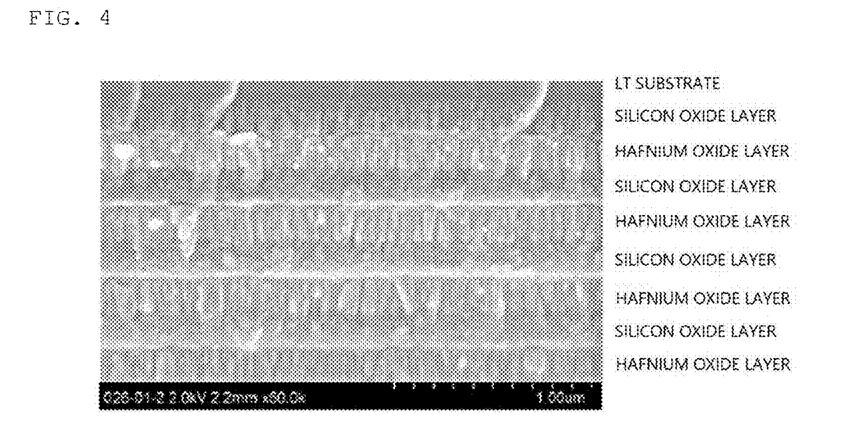
FIG. 4 is a sectional SEM observation photograph of a composite substrate (reflective layer) of Example 1-1.

A section of the resultant composite substrate (reflective layer) was observed with a SEM (at a magnification of 200,000). An observation photograph is shown in FIG. 4. At the time of the sectional SEM observation, a sample for observation was produced from the resultant composite substrate by a rupture method.

As shown in FIG. 4, in each of the hafnium oxide layers, granular growth was slightly observed at the initial stage of the layer formation (on the LT substrate side), but columnar growth was observed after the initial stage of the layer formation. Specifically, it was recognized that a structure changes in one hafnium oxide layer.

Comparative Example 1-1

A composite substrate was obtained in the same manner as in Example 1-1 except that in the layer formation conditions in the sputtering, the pressure was changed to 0.40 Pa. A section of the resultant composite substrate (reflective layer) was observed with a SEM in the same manner as in Example 1-1. An observation photograph is shown in FIG. 5.

Figure 5:
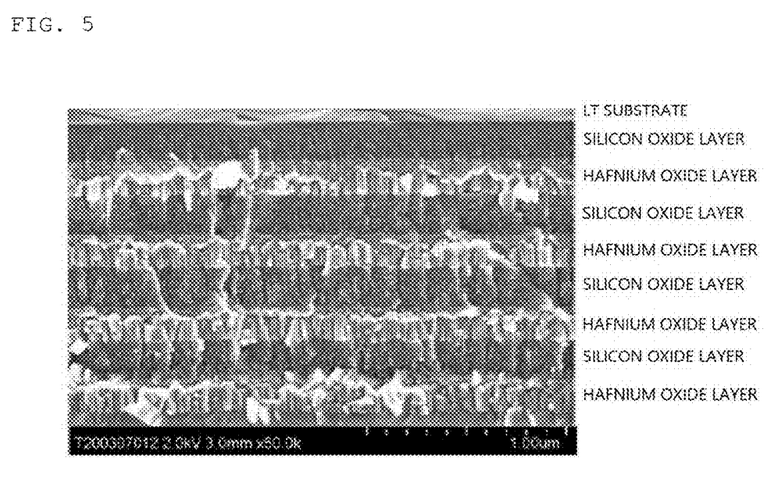
FIG. 5 is a sectional SEM observation photograph of a composite substrate (reflective layer) of Comparative Example 1-1.

As shown in FIG. 5, in each of the hafnium oxide layers, granular growth was observed from the initial stage of the layer formation to the middle stage thereof (on the LT substrate side), and columnar growth was observed after the middle stage of the layer formation. Specifically, it was clearly recognized that a structure changes in one hafnium oxide layer.

<Evaluation 1>

The composite substrates of Example 1-1 and Comparative Example 1-1 were evaluated for heat resistance. Specifically, each of the resultant composite substrates was heated at 200° C. for 15 minutes, and was cooled. After that, a section of the composite substrate was observed with a SEM.

Figure 6:
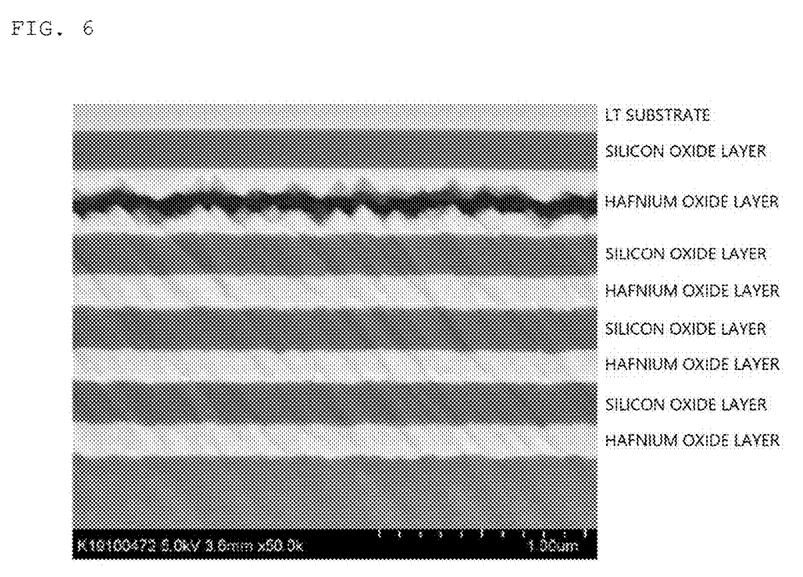
FIG. 6 is a sectional SEM observation photograph of the composite substrate (reflective layer) of Comparative Example 1-1 after its heating.

In Comparative Example 1-1, as shown in FIG. 6, peeling was observed in the hafnium oxide layer. It was recognized from FIG. 6 that the peeling occurred at an interface between the region of granular structures and the region of columnar structures. In contrast, in Example 1-1, no peeling was observed.

Example 2-1

A sample for identification was obtained in the same manner as in Example 1-1 except that: only one hafnium oxide layer was formed in the formation of the reflective layer; and no joining layer was formed.

Examples 2-2, 2-3, 2-4, and 2-5

A sample for identification was obtained in the same manner as in Example 2-1 except that the layer formation condition (pressure) in the sputtering was changed.

Comparative Example 2-1

A sample for identification was obtained in the same manner as in Comparative Example 1-1 except that: only one hafnium oxide layer was formed in the formation of the reflective layer; and no joining layer was formed.

Comparative Examples 2-2 and 2-3

A sample for identification was obtained in the same manner as in Comparative Example 2-1 except that the layer formation condition (pressure) in the sputtering was changed.

<Evaluation 2>

Figure 7:
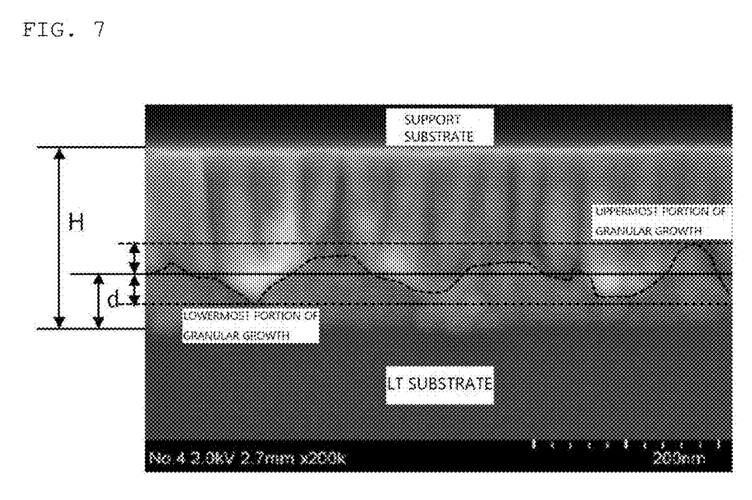
FIG. 7 is a sectional SEM observation photograph of Example 2-3.

A section of each of the resultant samples for identification was observed with a SEM (at a magnification of 200,000), and a boundary between first structures (granular structures or columnar structures) and second structures (granular structures or columnar structures) was identified, followed by the determination of the region of the first structures. For example, a sectional SEM observation photograph of Example 2-3 is shown in FIG. 7. The uppermost portion of granular growth and the lowermost portion of the granular growth were identified with respect to the surface of the LT substrate, and an intermediate position between both the portions was determined. A distance from the surface to the position was adopted as the thickness of the region of the granular structures. The ratio (%) of the granular structures was determined by calculating the ratio (thickness "d" of region of granular structures/thickness H of hafnium oxide layer) of the thickness "d" of the region of the granular structures to the thickness H of the hafnium oxide layer.

As shown in FIG. 7, in each of Examples 2-1 to 2-5 and Comparative Examples 2-1 to 2-3, the boundary between the granular structures and the columnar structures was observed, and as can be seen from the calculation equation, the ratio (%) of the columnar structures is a value obtained by subtracting the ratio of the granular structures from 100.

The resultant samples for identification were evaluated for heat resistance in the same manner as in Evaluation 1. The evaluation results of the heat resistance (presence or absence of the occurrence of peeling) are summarized in Table 1 together with the ratio of the first structures.

TABLE 1

| | Layer formation condition: pressure | Ratio of first structures | Presence or absence of peeling |
|---|---|---|---|
| Example 2-1 | 0.65 Pa | 95% (columnar) | Absent |
| Example 2-2 | 0.60 Pa | 85% (columnar) | Absent |
| Example 2-3 | 0.55 Pa | 75% (columnar) | Absent |
| Example 2-4 | 0.25 Pa | 75% (granular) | Absent |
| Example 2-5 | 0.20 Pa | 80% (granular) | Absent |
| Comparative Example 2-1 | 0.40 Pa | 50% (granular) | Present |
| Comparative Example 2-2 | 0.30 Pa | 70% (granular) | Present |
| Comparative Example 2-3 | 0.50 Pa | 30% (granular) | Present |

In each of Comparative Examples, the peeling was observed in the hafnium oxide layer as a result of the heating. As in Comparative Example 1-1 (FIG. 5), it was recognized that the peeling occurred at the boundary between the region of the granular structures and the region of the columnar structures. In contrast, in each of Examples, no peeling was observed.

INDUSTRIAL APPLICABILITY

The composite substrate according to one embodiment of the present invention may be suitably used in a surface acoustic wave element.

What is claimed is:

1. A composite substrate, comprising:
   a piezoelectric layer; and
   a reflective layer arranged on a rear surface side of the piezoelectric layer,
   wherein the reflective layer includes a high-impedance layer and a low-impedance layer containing silicon oxide, and
   wherein a ratio of a region of first structures in the high-impedance layer is more than 70%, and
   wherein the first structures are unevenly distributed on a side of an interface with an adjacent layer or an air layer opposite the other interface of the high-impedance layer in a thickness direction of the high-impedance layer.

2. The composite substrate according to claim 1, wherein the first structures are columnar structures or granular structures.

3. The composite substrate according to claim 1, wherein the high-impedance layer contains at least one selected from: hafnium oxide; tantalum oxide; zirconium oxide; and aluminum oxide.

4. The composite substrate according to claim 1, wherein the high-impedance layer has second structures, and a boundary between the first structures and the second structures is present in the high-impedance layer.

5. The composite substrate according to claim 1, wherein the high-impedance layer and the low-impedance layer each have a thickness of from 0.01 μm to 1 μm.

6. The composite substrate according to claim 1, wherein the high-impedance layer and the low-impedance layer are alternately laminated in the reflective layer.

7. The composite substrate according to claim 1, further comprising a support substrate arranged on a rear surface side of the reflective layer.

8. The composite substrate according to claim 7, further comprising a joining layer arranged between the reflective layer and the support substrate.

9. A surface acoustic wave element, comprising the composite substrate of claim 1.

* * * * *